United States Patent [19]

Laridon et al.

[11] 4,065,524

[45] Dec. 27, 1977

[54] FILM-FORMING LIGHT-SENSITIVE POLYMERIC MATERIAL CARRYING AZIDOSULFONYL GROUPS

[75] Inventors: Urbain Leopold Laridon; Gerard Albert Delzenne, both of Wilrijk-Antwerp, Belgium; Helmut Mader, Leverkusen, Germany; Hans Ulrich, Leverkusen, Germany; Bernhard Seidel, Cologne-Mulheim, Germany

[73] Assignee: AGFA-GEVAERT N.V., Mortsel, Belgium

[21] Appl. No.: 558,622

[22] Filed: Mar. 17, 1975

Related U.S. Application Data

[63] Continuation of Ser. No. 463,851, June 14, 1965, abandoned.

[30] Foreign Application Priority Data

June 15, 1964 United Kingdom ............... 24760/64

[51] Int. Cl.$^2$ ...................... C08G 75/18; C08G 75/30

[52] U.S. Cl. ...................... 260/895; 96/91 N; 96/115 P; 204/159.14; 260/29.2 EP; 260/29.6 H; 260/29.6 HN; 260/29.6 RW; 260/32.6 A; 260/32.8 R; 260/33.8 EP; 260/33.8 UA; 260/49; 260/79.3 M; 260/79.3 MU; 260/896; 526/9; 526/11; 526/19; 526/30; 526/51

[58] Field of Search .......... 260/49, 79.3 M, 79.3 MU, 260/895, 896

[56] References Cited

U.S. PATENT DOCUMENTS

| | | | |
|---|---|---|---|
| 3,058,944 | 10/1962 | Breslow et al. | 260/41 R |
| 3,058,957 | 10/1962 | Breslow | 260/79.3 MU |
| 3,203,937 | 8/1965 | Breslow et al. | 260/79.3 MU |
| 3,449,294 | 6/1969 | Danhäuser et al. | 260/47 EN |

*Primary Examiner*—Harold D. Anderson
*Attorney, Agent, or Firm*—A. W. Breiner

[57] ABSTRACT

Photo-sensitive film-forming soluble polymeric materials containing one or two polymers which can be insolubilized photochemically are disclosed. These polymeric materials contain in the same or different polymers (A) components which are reactive with moieties obtained by the photochemical decomposition of azidosulphonyl groups, e.g., a hydroxyl radical, pyridine, a phenyl radical, or a lactam radical; and (B) azidosulphonyl groups. The photo-sensitive material is insolubilized by exposure to actinic light. The material is useful in the production of photographic resists, printing plates for lithography, and the like.

12 Claims, No Drawings

FILM-FORMING LIGHT-SENSITIVE POLYMERIC MATERIAL CARRYING AZIDOSULFONYL GROUPS

This is a continuation of application Ser. No. 463,851 filed June 14, 1965, now abandoned.

The present invention relates to photochemically reactive film-forming polymers, to the production of printing plates, and to printing plates utilizing said polymers.

It is known to sensitize layers of albumin, gelatin and other colloids by the incorporation of ammonium dichromate. Upon exposing these layers photographically, the exposed areas become insoluble whereas the non-exposed areas remain soluble and can be washed away. A difficulty is that with these layers sensitized with dichromate it is necessary to perform sensitization just prior to the exposure because the sensitized surface does not keep very well. The problem is to find a process which employs a sensitive layer which is manufactured and thereafter can be stored for a considerable time until exposing and subsequently processing.

It is an object of the present invention to provide a new class of polymers which can be insolubilized photochemically. Another object is to provide improved photographic layers containing these new polymers. Still another object is to provide improved photographic resist materials and printing plates for lithography and other related processes. Other objects will become apparent from the following description and examples.

The process for the photochemical insolubilization of polymers in accordance with the invention comprises exposing to actinic light selected portions of a photo-sensitive composition, consisting essentially of a soluble polymeric material carrying (A) groups which are reactive with intermediates of moieties deriving from the photochemical decomposition of sulfonyl azide groups and (B) sulfonyl azide substituents.

The soluble polymeric material carries groups which are reactive with intermediates derived from the photochemical decomposition of sulfonyl azide groups. Among these reactive groups are especially of value hydroxyl groups, pyridine groups, phenyl groups, lactam groups; etc. These reactive groups may be substituted directly on the main polymeric chain as well as on side chains. In addition to the above described reactive groups the soluble polymeric material carries light-sensitive sulfonyl azide substituents too.

The polymeric material carrying the reactive groups and the sulfonyl azide substituents may be a chemically modified natural polymer of a synthetic polymerization, polycondensation or polyaddition product. This polymeric material can be obtained according to different manufacturing processes. For example, polymeric materials having sulfonyl chloride substituents may be allowed to react with sodium azide. According to this reaction poly(m-chlorosulphonylstyrene) or poly(p-chlorosulphonylstyrene) is brought to react with sodium azide to obtain poly(m-azidosulphonylstyrene) and poly(p-azidosulphonylstyrene) respectively.

Other polymers carying sulphonyl azide substituents are obtained by reaction of m- or p-azidosulphonylbenzoyl chloride with polymers having free hydroxyl groups distributed along their polymeric chain. A polymer of this kind is poly(vinylbutyral) which still contains a substantially amount of free hydroxyl groups. The same reaction can be applied to polycondensation products of 2,2-bis(4-hydroxyphenyl)-propane and epichlorhydrine.

According to a special embodiment of the invention, the groups which are reactive with intermediates deriving from the photochemical decomposition of sulphonyl azide groups, and the sulphonyl azide substituents themselves are substituted on two different polymeric materials, the mixture of which constitutes the polymeric composition which is to be photochemically insolubilized. In this way a solution of poly(vinylpyridine) may be mixed with a solution of poly(2-chloro-5-azidosulphonylstyrene) which mixture constitutes a photo-sensitive composition which can be cross-linked and rendered insoluble by irradiation with actinic light.

When speaking in the following description of a photo-sensitive polymeric material carrying sulphonyl azide substituents, there is to be understood one and the same polymer carrying both reactive groups and sulphonyl azide substituents, as well as a mixture of two polymers the first of which carries the reactive groups and the other one caries the sulphonyl azide substituents.

There are, however, still other ways for extending the series of polymeric materials which can be photo-insolubilized by the process of the present invention. So, the reaction of sodium azide upon poly(chlorosulphonylstyrene) can also be applied to copolymers of chlorosulphonylstyrene with other vinyl monomers, e.g. acrylonitrile or acrylic acid esters as well as butadiene or ternary mixtures. Of course, the comonomers used will influence the properties of the obtained light-sensitive polymeric sulphonylazides. This is a way to adapt the properties of the polymeric sulphonylazides, such as solubility, chemical resistance and sensitivity, to the requirements of the desired application.

Under the influence of light the sulphonylazide substituents are probably decomposed into sulphonylnitrene radicals, which immediately react with the reactive groups present in the polymeric material and cross-link the polymer to the insoluble state.

The above reaction is only given by way of explanation of what really occurs when the photo-sensitive polymeric material of the invention is exposed to actinic light rays. The invention, however, is independent of the real reaction which occurs and of whatever the mechanism of cross-linking may be.

The relative proportions of sulphonyl azide and reactive groups in the soluble polymeric material are fully determined by the structure of the polymer itself and can be varied over a whole range of concentrations as will be further shown in the examples.

Cross-linking of the soluble polymeric material can be effected to some extent by simply subjecting it to actinic light rays. However, in order to obtain the optimum degree of insolubilization and a faster reaction, it is preferred to effect the reaction in the presence of catalytic amounts of activating dyes. Among these may be mentioned Michler's ketone, and analogues, 4H-quinolizin-4-one, certain naphthothiazolines and pyrazolines, and the like.

The polymeric materials may be exposed to actinic light from any source and of any type. The light source should preferably, although not necessarily, furnish an effective amount of ultraviolet radiation. Suitable sources of light include carbon arcs, mercury vapor lamps, fluorescent lamps, argon glow lamps, photographic flood lamps and tungsten lamps.

For initiating the photochemical cross-linking by means of the sulphonyl azide substituents a very strong light source is not needed. Indeed, in most of the examples described hereinafter, a 80 Watt Philips mercury vapor lamp, placed at a distance of about 15 cm of the surface to be polymerized, is used. Brighter light sources are generally not needed since at these relatively low light intensities the photochemically cross-linking influence of the sulphonylazide substituents is found to be strong enough.

In the photochemical insolubilization of polymeric materials carrying sulphonylazide substituents high temperatures are not needed. The exposure, however, to strong light sources at a relatively short distance brings about a certain heating of the mass to be cross-linked, which heating exercises a favorable influence upon the cross-linking rate.

It has been found that the polymeric material carrying sulphonylazide substituents according to the invention is photo-sensitive, in the sense that its exposure to light causes its insolubilization. Thus, if a layer of such a photo-sensitive polymeric material, initially soluble, is applied to a support and exposed photographically the exposed areas become insoluble.

The invention is valuable in forming plates and films wholly made of the photo-sensitive polymeric material. The present process also makes possible the formation of coated printing films on any base by the deposition according to any known process of films or coatings of the photo-sensitive polymeric material. Typical bases are metal sheets (e.g. copper, aluminum, zinc, magnesium, etc.), glass, cellulose ester film, poly(vinyl acetal) film, polystyrene film, polycarbonate film, poly(ethylene terephthalate) film, paper, etc. For screen printing nets of metal, e.g. of bronze and steel, as well as of polyamides such as nylon fabrics are well suited.

The base or support is coated with a solution of the photo-sensitive polymeric material in a suitable solvent, whereupon the solvent or solvent mixture is eliminated by known means such as evaporation, leaving a more or less thin coating of the photo-sensitive polymeric material upon the base or support. Thereafter the dried photo-sensitive coating is exposed to actinic light rays.

When the support material carrying the photo-sensitive polymeric material is light-reflecting, there may be present, e.g. superposed on said support and adherent thereto or in the surface thereof, a layer or stratum absorptive of actinic light such as to minimize reflectance from the combined support of incident actinic light.

If the photo-sensitive polymeric material is water-soluble water may be used as solvent in coating the support. On the contrary, if photo-sensitive polymeric materials insoluble in water are used, organic solvents, mixtures of organic solvents or mixtures of organic solvents and water may be used. E.g. when using mixtures of polymers bearing azidosulphonyl substituents with water-soluble colloids such as poly(N-vinylpyrrolidone), warm or cold water can be used as developer.

The plates formed wholly of or coated with the photo-sensitive polymeric material are useful in photography, photomechanical reproductions, lithography and intaglio printing. More specific examples of such uses are offset printing, silk screen printing, duplicating pads, manifold stencil sheeting coatings, lithographic plates, relief plates, and gravure plates. The term "printing plates" as used in the claims is inclusive of all of these.

In comparison to the azides known hitherto wherein the azide group is directly linked to aromatic nuclei sulphonyl azides present the advantage of being much more easily prepared.

A specific application of the invention is illustrated by a typical preparation of a printing plate. In this application, a plate, usually of metal, is coated with a film of the photo-sensitive composition. When the plate is not of metal it may consist wholly of the photo-sensitive composition or it may be coated with a layer thereof. In all these cases the surface of the plate is then exposed to light through a contacted process transparency, e.g. a process positive or negative (consisting solely of opaque and transparent areas and where the opque areas are of the same optical density, the so-called line or half-tone negative or positive). The light induces the reaction which insolubilizes the areas of the surface beneath the transparent portions of the image, whereas the areas beneath the opaque portions of the image remain soluble. The soluble areas of the surface are then removed by a developer, and the insoluble raised portions of the film which remain can serve as a resist image, whereas the exposed base material is etched, forming a relief plate, or the plate can be inked and used as a relief printing plate directly in the customary manner.

After washing away the non-exposed and thus soluble parts of the layer or film, the polymer parts made insoluble by exposure to actinic light may be subjected, if desired, to other known hardening techniques. Of course, these hardening techniques will depend upon the kind of the light-sensitive polymer used. When e.g. the original polymer is an epoxy resin of 2,2-bis(4-hydroxyphenyl)-propane and epichlorohydrin which contains sulphonyl azide groups, the insolubilized polymer part remaining after exposure and development can still be hardened supplementarily according to known techniques for epoxy resins.

The purpose of this additional hardening is to strengthen the insolubilized polymer parts as much as possible. If e.g the remaining insolubilized polymer surface is to be used as a printing plate a suchlike subsequent hardening often is desirable.

The thickness of the photo-sensitive layer is a direct function of the thickness desired in the relief image and this will depend on the subject being reproduced and particularly on the extent of the non-printing areas. In the case of half-tones the screen used is also a factor. In general, the thickness of the photo-sensitive layer will vary from about 0.001 mm to about 7 mm. Layers ranging from about 0.001 to about 0.70 mm in thickness will be used for half-tone plates. Layers ranging from about 0.25 to about 1.50 mm in thickness will be used for the majority of letterpress printing plates, including those wherein half-tone and line images are to be combined.

The solvent liquid used for washing or "developing" the printing plates made from the photo-sensitive composition must be selected with care, since it should have good solvent action on the unexposed areas, yet have little action on the hardened image or upon the base material, the anti-halation layer, or the subbing layer with which the photo-sensitive composition may be anchored to the support.

When the photo-sensitive polymeric material is to be applied to a metal support, the polymeric material can be selected from polyvinylbutyrals and polyepoxy resins, of which the great adhesivity to metals is known.

Further, the solubility of the starting material and also the solvent, which will be used to "develop" the photographic image, can be adapted to the final destination of the photochemically cross-linked polymeric

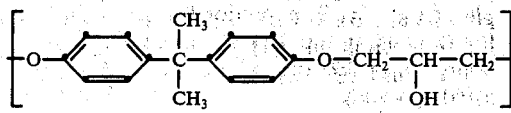

material. A still further advantage of the present photo-sensitive compositions is that they can be prepared a considerable time before use.

The photo-sensitive polymeric materials are suitable for other purposed in addition to the printing uses described above, e.g. as ornamental plaques or for producing ornamental effects, as patterns for automatic engraving machines, foundry molds, cutting and stamping dies, name stamps, relief maps for braille, as rapid cure coatings, e.g. on film base, as sound tracks on film, for embossing plates, paper, e.g. with a die prepared from the photopolymerizable compositions, in the preparation of printed circuits, and in the preparation of other plastic articles.

The following examples illustrate the present invention.

EXAMPLE 1

A. Preparation of m-azidosulphonyl-benzoic acid

In a three-necked flask fitted with stirrer and dropping funnel 65 g of sodium azide is dissolved in 900 ccs of water. While stirring and cooling till 0°–5° C a solution of 198 g of m-chlorosulphonyl-benzoic acid in 900 ccs of acetone is added dropwise. Then stirring is continued for 30 minutes whereupon the solution obtained is poured into 2 liters of water. The white precipitate formed is sucked off, washed with water and dried in vacuo. Melting point: 143° C.

B. Preparation of m-azidosulphonyl-benzoyl chloride

In a flask provided with a reflux condensor 175 g of m-azidosulphonyl-benzoic acid and 500 ccs of thionyl chloride are refluxed for approximately 4 hours. The excess of thionyl chloride is distilled off in vacuo and the residue is recrystallized from a mixture of 100 ccs of hexane and 100 ccs of benzene. Melting point: ± 40° C.

C. Reaction of m-azidosulphonyl-benzoyl chloride with polyether of 2,2-bis(4-hydroxyphenyl)-propane and epichlorohydrin In an Erlenmeyer flask are placed:
100 g of polyether of 2,2-bis(4-hydroxyphenyl)-propane and epichlorohydrin (intrinsic viscosity: 0.47 dl/g measured at 25° C in sym. tetrachloroethane)
50 ccs of pyridine
42 g of m-azidosulphonyl-benzoyl chloride, and
1 liter of methylene chloride.

The mixture is shaken till complete dissolution and allowed to stand for 48 hours in the dark at room temperature. Then the solution is poured while stirring vigorously in 5 liters of methanol. The formed precipitate is sucked off and washed with methanol whereupon it is dried. Nitrogen content: 2.92%. The modified polyether corresponds to the following formula:

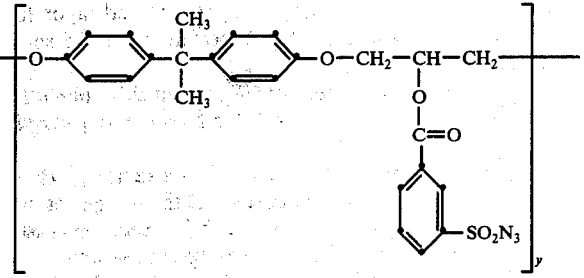

wherein x is 2 and y is 1.

D. Photochemical cross-linking 0.025 g of the above modified polyether are dissolved in 2 ccs of methylene chloride and 1 cc of sym-tetrachloroethane. The solution formed is coated onto an aluminum foil in such a way that after drying a layer of approximately 1 μ is obtained. Said layer is exposed through a negative by means of an 80 Watt Philips mercury vapor lamp placed at a distance of 15 cm. After exposure the layer is washed with a mixture of equal parts of methylene chloride and sym.tetrachloroethane whereby the unexposed parts are washed away. For obtaining a good image an exposure time of 30 minutes is required.

EXAMPLE 2

The procedure of example 1D is repeated with the difference, however, that to the composition for being applied to the aluminum foil 2.5 mg of Michler's ketone are added as activator. When the exposure takes place by means of an 80 Watt Philips mercury vapor lamp an exposure time of 5 sec. suffices for obtaining a good image, whereas when using an ordinary 300 Watt lamp an exposure time of 30 sec. is required.

EXAMPLES 3–11

To investigate the influence of varying contents of sulphonylazide groups on the photochemical cross-linking of polymeric materials, samples of the polyether of 2,2-bis(4-hydroxyphenyl)-propane and epichlorohydrin are allowed to react with varying quantities of m-azidosulphonyl-benzoyl chloride, following the procedure described in example 1C.

The polymeric material carrying both hydroxyl groups and sulphonylazide groups, the latter in varying quantities, were dissolved as described in example 1D with the addition of 10% by weight of Michler's keton. The solutions were coated onto aluminum foils, dried, exposed to light and developed as described above. The results are given in the following table:

| Example | Mol % of sulphonylazido groups in polyether | Exposure time required |
| --- | --- | --- |
| 3 | 4.5 | 15 sec. |
| 4 | 7 | 10 sec. |
| 5 | 19 | 7½ sec. |
| 6 | 26 | 10 sec. |
| 7 | 32 | 10 sec. |
| 8 | 42 | 10 sec. |
| 9 | 61 | 10 sec. |
| 10 | 66 | 15 sec. |
| 11 | 93 | 15 sec. |

From the above results the following conclusions can be drawn:

a. that even with a content of 4.5 mol % of sulphonylazide substituents on the polymeric chain, a good image is obtained after exposing the coated layer to an 80 Watt Philips mercury vapor lamp for 15 seconds;
b. that an increasing content of sulphonylazide substituents only slightly improves the image-forming speed and
c. that polymers with a high mol % of sulphonylazide substituents rather give a decrease of the image-forming speed, probably due to the fact that with increasing sulphonylazide content in the same time the content of reactive hydroxyl groups is decreased.

EXAMPLE 12

A. Reaction of copoly(vinylbutyral/vinyl alcohol) with m-azidosulphonyl-benzoyl chloride In a 100 ccs Erlenmeyer flask, 1.5 g of copoly(vinyl) butyral/vinyl alcohol) (80/20) and 0.6 g of m-azidosulfonylbenzoyl chloride are dissolved in 15 ccs of pyridine while shaking. The solution formed is allowed to stand for 48 hours in the dark at room temperature whereupon the solution is poured into 200 ccs of water while stirring. The product formed is sucked off and dried in vacuo.

The copolymer obtained has the following formula:

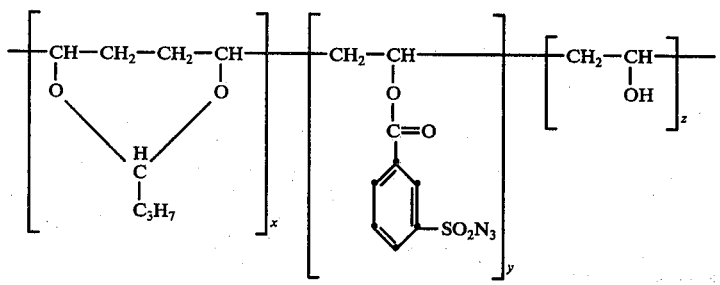

According to sulphur analysis the copolymer is composed of 80 mol % of vinyl butyral groups, 3 mol % of vinyl-m-(azidosulphonyl)-benzoate groups and 17 mol % of vinyl alcohol groups.

B. Photochemical cross-linking

A solution is formed comprising:
0.025 g of the copolymer obtained in A
0.0025 g of Michler's ketone
2 ccs of methylene chloride, and
1 cc of sym-tetrachloroethane.

The solution is coated onto an aluminum foil in such a way that after drying a layer of about 1 μ thickness is obtained. Exposure and development occur as in the foregoing examples. The exposure time required when employing an 80 Watt mercury vapor lamp is 3 seconds.

EXAMPLE 13

A. Reaction of p-azidosulphonyl-benzoyl chloride with polyether of 2,2-bis(4-hydroxyphenyl)-propane and epichlorohydrin In an Erlenmeyer flask a solution is prepared, while shaking, of the following composition:
1 g of polyether of 2,2-bis(4-hydroxyphenyl)-propane and epichlorohydrin
0.5 g of p-azidosulphonyl-benzoyl chloride
10 ccs of methylene chloride, and
5 ccs of pyridine.

The p-azidosulphonyl-benzoyl chloride (melting point: 68° C) was prepared in analogous way as in example 1 (A and B). The solution formed is allowed to stand for 48 hours in the dark at room temperature and then poured into 200 ccs of methanol. The precipitate is dried in vacuo.

B. Photochemical cross-linking

In a mixture of 10 ccs of methylene chloride and 5 ccs of pyridine, 1 g of the modified polyether obtained in A is dissolved together with 0.1 g of Michler's ketone. The solution formed is coated onto an aluminum foil whereupon the layer thus obtained is exposed and developed as described in the above examples. When employing for the exposure an 80 Watt Philips mercury vapor lamp an exposure time of 15 sec. suffices for obtaining a good image, whereas when using a ordinary 300 Watt lamp 90 sec. are required.

EXAMPLES 14–32

For having a survey of the action of various sensitizing agents a series of tests are carried out. These tests all proceed as follows:

Onto an aluminum foil is coated a solution of the following composition:
0.025 g of modified polyether of example 1C
0.0025 g of sensitizer (listed in the table below)
2 ccs of methylene chloride
1 cc of sym.-tetrachloroethane,
in such a way that after drying a layer of 1 μ thickness is obtained. The layer is exposed through a negative by means of an 80 Watt Philips mercury vapor lamp or an ordinary 300 Watt lamp placed at a distance of 15 cm. After exposure the layer is developed in a mixture of methylene chloride and sym.-tetrachloroethane (50:50).

The exposure times required in each of said tests for obtaining a good image are given in the table.

|     |     | Exposure time required | |
| --- | --- | --- | --- |
| Ex. | Sensitizing agent | with 80 W Philips mercury vapor lamp | with ordinary 300 W lamp |
| 14 | none | 30 min. | >30 min. |
| 15 | Michler's ketone | 5 sec. | 30 sec. |
| 16 | p-dimethylamino-acetophenone | 30 sec. | 15 min. |
| 17 | p-dimethylamino-benzophenone | 5 sec. | 1 min. |
| 18 | p-dimethylamino-benzaldehyde | 15 sec. | 5 min. |
| 19 | (p-dimethylamino-benzylidene)-malononitrile | 1 min. | 4 min. |
| 20 | α-phenyl-β-(p-dimethyl-aminophenyl)-acrylo-nitrile | 1 min. | 5 min. |

-continued

| Ex. | Sensitizing agent | Exposure time required with 80 W Philips mercury vapor lamp | with ordinary 300 W lamp |
|---|---|---|---|
| 21 | 4,4'-bis(dimethylamino)-benzhydrol | 20 sec. | 2 min. |
| 22 | 4H-quinolizin-4-one | 5 sec. | 1 min. |
| 23 | 1-methyl-2-benzoyl-methylenenaphtho[1,2-d]-thiazoline | 2 sec. | 20 sec. |
| 24 | 1,3-diphenyl-5-(p-iodo-phenyl)-2-pyrazoline | 15 sec. | 3 min. |
| 25 | p-(4,5-dihydro-1,3-diphenyl-5-pyrazolyl)-phenol | 20 sec. | 4 min. |
| 26 | 3,7-dimethylamino-thioxanthene-5,5-dioxide | 1 min. | 2 min. |
| 27 | 3-cyclohexyl-5-[3-methyl-4,5-diphenyl-(4-oxazolin-2-ylidene)]-rhodanine | 30 sec. | 2 min. |
| 28 | 3-ethyl-5-[3-methyl-4,5-diphenyl-(4-oxazolin-2-ylidene)]-rhodanine | 30 sec. | 2 min. |
| 29 | 1,3-diethyl-2-(3,3-dicyano-allylidene)-5-fluorobenzimidazoline | 1 min. | 2 min. |
| 30 | 3-ethyl-5-(3-ethyl-2-benzothiazolinylidene)-rhodanine | 1 min. | 4 min. |
| 31 | 3-ethyl-5-(3-ethyl-2-benzothiazolinylidene)-2-thio-2,4-oxazolidine-dione | 2 min. | 8 min. |
| 32 | 1,3-diethyl-2-(3,3-dicyano-allylidene)-5-chlorobenzimidazole | 30 sec. | 4 min. |

EXAMPLE 33

A. Poly(p-azidosulphonyl-styrene)

Polystyrene of molecular weight of about 30,000 is transformed into poly(p-chlorosulphonylstyrene) according to the method described in the U.S. Pat. Specification No. 2,759,816 of this poly(p-chlorosulphonylstyrene) 6 g are suspended in 100 ml of dioxan. A solution of 2.5 g sodium azide in 12.5 ccs of water and 30 ccs of dioxan is dropwise added while stirring. After 24 hours the product is precipitated with benzene and after decanting the solvents the product is air-dried.

B. Photochemical cross-linking

An amount of 5 g of poly(p-azidosulphonylstyrene) each fifth recurring unit of which carries an azidosulphonyl group, is dissolved in 100 ccs of dimethylformamide. Then 0.2 g of Michler's ketone is added. The obtained solution is applied as a thin layer to a zinc plate and then after complete drying exposed for about 1 min. behind a line original by means of a carbon arc lamp of 15A-45 V. After development with dimethylformamide, an insoluble relief is obtained on the exposed areas, whereas the non-exposed areas are completely eliminated by dissolution. When dipping the prepared printing plate in dilute nitric acid, the zinc base is etched only on the bare metal areas.

EXAMPLE 34

An amount of 2 g of poly(p-azidosulphonylstyrene) is dissolved in 25 ccs of dimethylformamide under yellow light and mixed with a solution of 4 g of poly(N-vinylpyrrolidone) (molecular weight: 90,000) and 0.2 g of Michler's ketone in 75 ccs of chloroform. The obtained solution is applied to a copper plate as a layer of 5-7 μ and air-dried. This material is then exposed for 2 min. behind a line original to a carbon arc lamp of 15A-45V and developed with water, methanol or chloroform. On the exposed areas an insoluble relief is left, which after drying can be coloured with solutions of dyes in organic solvents. An ethanolic solution e.g. of methylviolet colours the layer blue without leaving on the plate any colouring of the background after rinsing with water.

EXAMPLE 35

A. 2-chloro-5-azidosulphonylbenzoic acid

To a suspension of 12 g of 2-chloro-5-chlorosulphonylbenzoic acid in 150 ccs of ethanol, a solution of 10 g of sodium azide in 30 ccs of water and 120 ccs of ethanol is dropwise added whilst stirring. Stirring is continued overnight and the inorganic constituents are precipitated with acetone. After allowing to stand at 0° C for a relatively long period, the precipitate is filtered off and the mother liquor is carefully evaporated to dryness by means of a rotary evaporator.

B. poly-p-vinylbenzyl-(2-chloro-5-azidosulphonyl)-benzoate

To a solution of 12.6 g of the above 2-chloro-5-azidosulphonylbenzoic acid in 75 ccs of acetone and 125 ccs of ethanol, a solution of 1 g of sodium in 30 ccs of ethanol is added dropwise. To this mixture a solution of 14 g of poly (chloromethylstyrene), prepared according to Kunststoffe 50, 377 (1960) and Helv. Chim. Acta 40, 61 (1957), in 125 ccs of ethanol and 225 ccs of acetone is added whilst stirring. After stirring for 5 further hours at room temperature, the inorganic substances are filtered off and the filtrate is concentrated to dryness. Yield: 18 g.

C. Photochemical cross-linking

To a solution of 2 g of poly-p-vinylbenzyl-(2-chloro-5-azidosulphonyl)-benzoate in 100 ccs of a mixture of ethanol and acetone (1:1) 50 mg of Michler's ketone are added. This solution is coated as a thin layer onto an aluminum support, dried and exposed behind a line original as described in example 24.

After development in a solvent, a negative relief image of good definition is obtained of the original.

EXAMPLE 36

A 6% solution of poly(N-vinylpyrrolidone) in 100 ccs of chloroform is mixed with the solution obtained according to the method of example 35B. The further procedure is that of example 35C. The same result is obtained

EXAMPLE 37

Example 36 is repeated but using as an addition 100 ccs of a solution of a polystyrene (average molecular weight: 300,000) in a mixture of methylene chloride and xylene (1:1). The further procedure is that of example 36. The same result is obtained. The obtained relief is suited for being applied e.g. as etching resist when dilute nitric acid is used as etching agent.

What we claim is:

1. A film-forming light-sensitive polymeric material consisting essentially of one or two polymers, which is soluble before exposure to actinic light in an organic solvent or water and which becomes insoluble in said organic solvent or water when exposed to actinic light and having carried on said polymer or polymers (A) azidosulphonyl groups, and (B) a component which is reactive with moieties obtained upon the photochemical decomposition of azidosulphonyl groups by exposure to actinic light, said reactive component being selected from the group consisting of a hydroxyl radical, pyridine, a phenyl radical, and pyrrolidone, said (A) and (B) each being present in said polymeric material in an amount sufficient to, upon exposure of said polymeric material to actinic light, photochemically cross-link and render said polymeric material insoluble in said organic solvent or water.

2. A polymeric material as claimed in claim 1 in which the light-sensitive polymeric material is a mixture of two different polymers, one polymer containing the said (A) groups and the other polymer containing the said (B) component.

3. A polymeric material as claimed in claim 2 in which the polymer containing said (B) component is selected from the group consisting of poly(vinyl pyridine) and poly(N-vinyl pyrrolidone).

4. A polymeric material as claimed in claim 1 wherein one polymer contains both the said (A) groups and the said (B) component.

5. A polymeric material as claimed in claim 4 in which the said (B) component is free hydroxyl groups, and the said (A) groups are an ester of a hydroxyl group and an azidosulphonylbenzoyl chloride.

6. A polymeric material as claimed in claim 5 in which the polymer containing the said free hydroxyl groups is poly(vinyl butyral).

7. A polymeric material as claimed in claim 5 in which the polymer having free hydroxyl groups is the polycondensation product of 2,2-bis(4-hydroxyphenyl)-propane and epichlorohydrin.

8. A polymeric material as claimed in claim 5 in which the said azidosulphonylbenzoyl chloride is selected from the group consisting of m- and p-azidosulphonylbenzoyl chloride.

9. A polymeric material as claimed in claim 2 in which the polymer containing the said (A) groups is polystyrene transformed into poly(p-chlorosulphonylstyrene) and thereafter reacted with sodium azide.

10. A polymeric material as claimed in claim 2 in which the polymer containing the said (A) groups is the reaction product of poly(chloromethylstyrene) and 2-chloro-5-azidosulphonylbenzoic acid.

11. A light-sensitive film-forming polymeric material consisting essentially of one or two polymers having carried on said one or two polymers light-sensitive azidosulphonyl groups and groups selected from the group consisting of a hydroxyl radical, pyridine, a phenyl radical, and pyrrolidone which upon exposure to actinic light will react with said azidosulphonyl groups to provide a cross-linked, insoluble and infusible polymer.

12. The light-sensitive polymeric material of claim 11 wherein the azidosulphonyl groups are directly bonded to a phenyl moiety.

* * * * *